United States Patent
Chaware et al.

(10) Patent No.: US 9,418,909 B1
(45) Date of Patent: Aug. 16, 2016

(54) STACKED SILICON PACKAGE ASSEMBLY HAVING ENHANCED LID ADHESION

(71) Applicant: Xilinx, Inc., San Jose, CA (US)

(72) Inventors: Raghunandan Chaware, Sunnyvale, CA (US); Inderjit Singh, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/820,147

(22) Filed: Aug. 6, 2015

(51) Int. Cl.
*H01L 23/10* (2006.01)
*H01L 23/00* (2006.01)
*H01L 23/053* (2006.01)
*H01L 23/31* (2006.01)

(52) U.S. Cl.
CPC ............. *H01L 23/10* (2013.01); *H01L 23/053* (2013.01); *H01L 23/3142* (2013.01); *H01L 24/26* (2013.01); *H01L 24/29* (2013.01); *H01L 24/32* (2013.01); *H01L 24/83* (2013.01); *H01L 2224/8385* (2013.01); *H01L 2924/16196* (2013.01)

(58) Field of Classification Search
CPC ....... H01L 23/10; H01L 23/36; H01L 23/562; H01L 23/32; H01L 24/26; H01L 23/3142; H01L 24/29
See application file for complete search history.

(56) References Cited

U.S. PATENT DOCUMENTS

| | | | | |
|---|---|---|---|---|
| 5,770,478 A * | 6/1998 | Iruvanti | ............... | H01L 21/4878 257/E23.103 |
| 5,825,087 A * | 10/1998 | Iruvanti | ............... | H01L 21/4878 257/706 |
| 6,784,535 B1 * | 8/2004 | Chiu | ........................ | H01L 23/04 257/704 |
| 8,269,340 B2 * | 9/2012 | Gaynes | ................... | H01L 23/42 257/704 |
| 8,564,955 B2 * | 10/2013 | Schmidt | ................ | H01L 23/367 165/104.33 |
| 2006/0128068 A1 * | 6/2006 | Murray | ............... | H01L 21/4882 438/120 |
| 2006/0227510 A1 * | 10/2006 | Fitzgerald | ............... | H01L 23/42 361/704 |
| 2006/0238984 A1 * | 10/2006 | Belady | .................. | H01L 23/367 361/704 |
| 2016/0035637 A1 * | 2/2016 | Urago | ..................... | H01L 21/52 257/693 |

* cited by examiner

*Primary Examiner* — Alonzo Chambliss
(74) *Attorney, Agent, or Firm* — Keith Taboada; Robert M. Brush

(57) ABSTRACT

A method and apparatus are provided which improve the adhesion of a lid to an IC die of an IC (chip) package. In one embodiment, a chip package assembly is provided that includes an IC die, a package substrate and a lid. The IC die is coupled to the package substrate. The lid has a first surface and a second surface. The second surface of the lid faces away from the first surface and towards the IC die. The second surface of the lid has a plurality of engineered features. The adhesive couples the plurality of engineered features of the lid to the IC die.

19 Claims, 3 Drawing Sheets

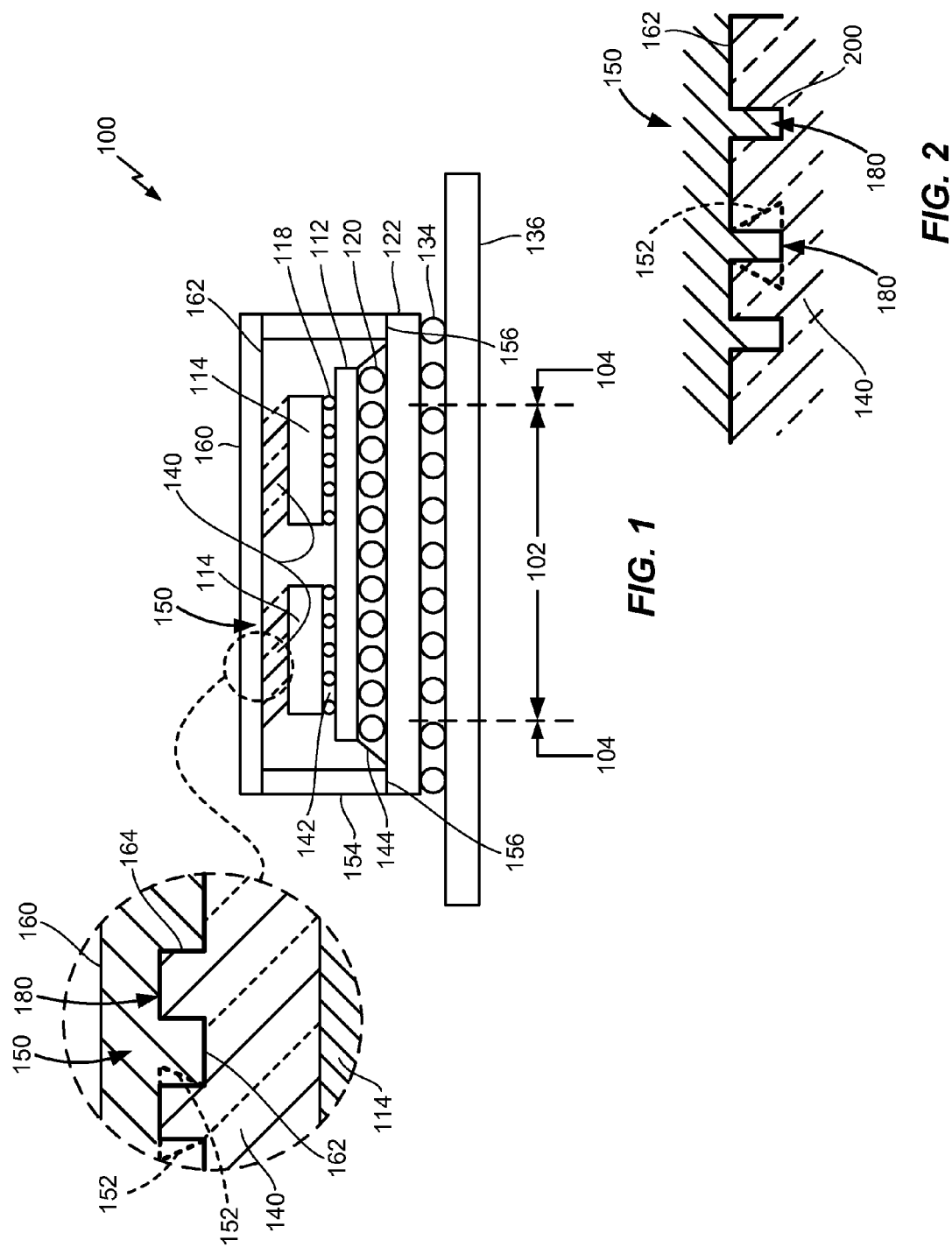

STACKED SILICON PACKAGE ASSEMBLY HAVING ENHANCED LID ADHESION

TECHNICAL FIELD

Embodiments of the present invention generally relate to a chip package assembly, and in particular, to chip package assembly comprising at least one integrated circuit (IC) die covered by a lid, the lid having enhanced adhesion to the package assembly.

BACKGROUND

Electronic devices, such as tablets, computers, copiers, digital cameras, smart phones, control systems and automated teller machines, among others, often employ electronic components which leverage chip package assembly for increased functionality and higher component density. Conventional chip packaging schemes often utilize package substrates, often in conjunction with a through-silicon-via (TSV) interposer, to enable a plurality of integrated circuit (IC) dies to be mounted to a single substrate. The IC dies may include memory, logic or other IC device.

In many instances, a lid is utilized to substantially cover one or more of the dies. The lid is part of the packaging of the IC structure. The lid can be formed of a plastic, metal or other suitable material, and is mounted to the die and interposer or package substrate using an adhesive, such as a heat transfer paste or other suitable bonding material. The lid functions to protect the die from damage, such as from impact from another object or from ultraviolet light which might damage the die.

The lid is often heated during installation over the die. Once the lid cools to room temperature, the lid may deform in a concave manner such that the center region of the lid becomes closest to the die. Once heated while in operation, the lid may straighten out and become more planar. The straightening of the lid in certain instances may cause the lid to become delaminated from the die. Once delaminated, the lid may become detached from the IC packaging. Additionally, the delamination of the lid from the die changes the rate of heat transfer between the die and lid, which may detrimentally effect device performance and reliability.

Therefore, a need exists for an improved chip package assembly, and in particular, to chip package assemblies having improved lid to integrated circuit (IC) die adhesion.

SUMMARY

A method and apparatus are provided which improve the adhesion of a lid to an IC die of an IC (chip) package assembly.

In one embodiment, a chip package assembly is provided that includes an IC die, a package substrate and a lid. The IC die is coupled to the package substrate. The lid has a first surface and a second surface. The second surface of the lid faces away from the first surface and towards the IC die. The second surface of the lid has a plurality of engineered features. The adhesive couples the plurality of engineered features of the lid to the IC die.

In another embodiment, a chip package assembly is provided that includes at least two IC dies, an interposer, a package substrate and a lid. The interposer is coupled to the package substrate. The IC dies are coupled to the interposer. The lid has a first surface and a second surface. The second surface of the lid faces away from the first surface and towards the IC dies. The second surface of the lid also has a plurality of engineered features. The adhesive couples the plurality of engineered features of the lid to the IC dies.

In another embodiment, a lid for a chip package assembly is provided. The improvement to the lid includes a plurality of engineered features disposed in a region of the lid configured to cover an IC die of the chip package assembly. The engineered features have a geometry selected to enhance adhesion of the lid to the IC die.

In yet another embodiment, a method for forming a chip package assembly is provide that includes applying an adhesive to one of an IC die mounted to a package substrate and a second surface of a lid, the first surface of the lid facing away from the second surface; and securing the lid to the IC die mounted to the package substrate utilizing the adhesive, wherein during the securing of the lid to the IC die, the adhesive contacts a plurality of engineered features formed on or in the second surface of the lid.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a cross sectional schematic view of an integrated chip package assembly including one or more IC dies covered by a lid.

FIG. 2 is a partial sectional view of an alternative embodiment of a lid which may be utilized in the integrated chip package assembly of FIG. 1.

To facilitate understanding, identical reference numerals have been used, where possible, to designate identical elements that are common to the figures. It is contemplated that elements of one embodiment may be beneficially incorporated in other embodiments.

DETAILED DESCRIPTION

Figure 3:
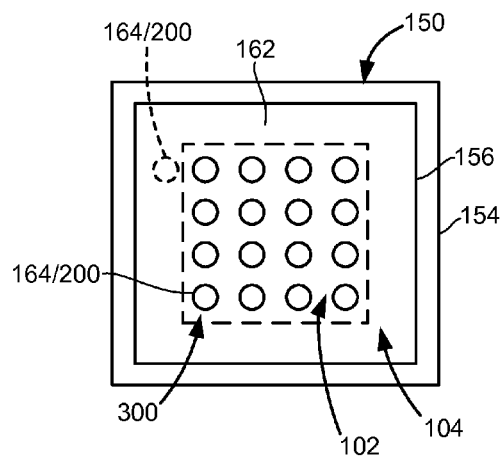
FIG. 3 is a bottom view of one embodiment of the lid utilized in the integrated chip package assembly of FIG. 1.

Embodiments of the invention generally provide a chip package assembly having one or more integrated circuit (IC) dies covered by a lid. The lid includes engineered surface features that enhance the adhesion between the IC die and the lid. Advantageously, the enhanced adhesion between the IC die and the lid reduces the potential of the lid delaminating from the chip package assembly. Thus, the enhanced adhesion promotes improved heat transfer between the IC die and lid, thereby enhancing temperature control which promotes better device performance over a wider range of operating conditions, with less expense and manufacturing complexity, while additionally providing more uniform chip package assembly to chip package assembly performance.

Turning now to FIG. 1, an exemplary integrated chip package assembly 100 is schematically illustrated. The chip package assembly 100 includes at least one or more IC dies 114 connected optionally by a silicon-through-via (TSV) interposer 112 to a package substrate 122. Although two IC dies 114 are shown in FIG. 1, the number of IC dies may range from one to as many as can be fit within the chip package assembly 100.

The interposer 112 includes circuitry for electrically connecting the dies 114 to circuitry of the package substrate 122. The circuitry of the interposer 112 may optionally include transistors. Package bumps 120, also known as "C4 bumps," are utilized to provide an electrical connection between the circuitry of the interposer 112 and the circuitry of the package substrate 122. The package substrate 122 may be mounted and connected to a printed circuit board (PCB) 136, utilizing solder balls 134, wire bonding or other suitable technique. An undermolding 144 may be utilized to fill the space not taken by the package bumps 120 between the PCB 136 and the interposer 112.

The IC dies 114 are mounted to one or more surfaces of the interposer 112, or alternatively in embodiments wherein an interposer is not utilized, to the package substrate 122. The IC dies 114 may be programmable logic devices, such as field programmable gate arrays (FPGA), memory devices, optical devices, processors or other IC logic structures. Optical devices include photo-detectors, lasers, optical sources, and the like. In the embodiment depicted in FIG. 1, the IC dies 114 are mounted to a top surface of the interposer 112 by a plurality of micro-bumps 118. The micro-bumps 118 electrically connect the circuitry of each IC die 114 to circuitry of the interposer 112. The circuitry of the interposer 112 connects the micro-bumps 118 to selective package bumps 120, and hence, connects selective circuitry of each IC die 114 to the package substrate 122, to enable communication of the dies 114 with the PCB 136 after the chip package assembly 100 is mounted within an electronic device (not shown). When the optional interposer 112 is not present, the micro-bumps 118 connects selective circuitry of each IC die 114 to the package substrate 122 to enable communication of the dies 114 with the PCB 136. An undermolding 142 may be utilized to fill the space not taken by the micro-bumps 118 between the dies 114 and interposer 112.

The chip package assembly 100 additionally includes a stiffener 154. The stiffener 154 is coupled to the package substrate 122 and circumscribes the IC dies 114. The stiffener 154 can extend to peripheral edges 156 of the package substrate 122 to provide mechanical support which helps prevent the chip package assembly 100 from bowing. The stiffener 154 may be a single layer structure or a multi-layer structure. The stiffener 154 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 154 can also be made of organic materials such as copper-clad laminate.

A lid 150 is disposed over the dies 114. In some embodiments, the lid 150 may be fabricated from a plastic material or other suitable material. In other embodiments particularly where it is desirable to utilize the lid 150 to receive heat from the dies 114, the lid 150 may be fabricated from a thermally conductive material, such as copper, nickel-plated copper or aluminum, among other suitable materials. The lid 150 may have a thickness of between about 0.5 mm and about 3.0 mm, although other thicknesses may be utilized.

The lid 150 has a first surface 160 and a second surface 162. The first surface 160 forms the exterior top surface of the chip package assembly 100, while the second surface 162 faces the dies 114. A heat sink, not shown, may optionally be mounted to the first surface of the lid 150. The second surface 162 of the lid 150 may be coupled to the stiffener 154. For example, the second surface 162 of the lid 150 may be coupled to the stiffener 154 by an adhesive (not shown), such as an epoxy.

An adhesive 140 is utilized to couple the lid 150 to the dies 114. The adhesive 140 may be selected to provide a thermally conductive path between the lid 150 to the dies 114 so that heat generated by the dies 114 may be dissipated through the lid 150. The adhesive 140 may be a soft or compliant adhesive to allow compensation between mismatched heights of neighboring dies 114 within the chip package assembly 100. In one example, the adhesive 140 may be a thermal gel or thermal epoxy, such as for example, packaging component attach adhesives available from AI Technology, Inc., located in Princeton Junction, N.J.

The second surface 162 of the lid 150 may include engineered features 180 which improve the interface between the lid 150 and the adhesive 140. In one example, the engineered features 180 may enhance the adhesion between the lid 150 and the adhesive 140. Increased adhesion between the lid 150 and the adhesive 140 helps maintain the lid 150 firmly attached to the chip packaging 100. Alternatively or in addition increasing the adhesion between the lid 150 and the adhesive 140, the engineered features 180 may enhance the rate of heat transfer between the lid 150 and the adhesive 140. Increased heat transfer between the lid 150 and adhesive 140 helps maintain the temperature of the die 114, which in turn improves device performance and helps maintain performance uniformity between different chip packaging.

The engineered feature 180 is generally a predefined structure formed in or on the second surface 162 of the lid 150. For example, a predefined structure may be formed with a predefined geometry, such as cross-sectional area, height (or depth), width and pitch between structure. The engineered features 180 may be formed in a predefined pattern, for example, a pattern of structures that are spaced at regular and repeating intervals.

As only a region 102 of the lid 150 above the dies 114 needs to be in contact with the adhesive 140, the engineered features 180 may be only disposed in the region 102. Thus, a region 104 of the lid 150, typically disposed outward of region 102, may be free of engineered features 180, thereby reducing manufacturing costs. Alternatively, the engineered features 180 may extend completely or almost completely across the second surface 162 of the lid 150. That is, the engineered features 180 may be present in both regions 102, 104.

The engineered features 180 function to increase the surface area of the lid 150 that is in contact with the adhesive 140. The increased surface area improves the adhesion between the lid 150 and the adhesive 140, thus reducing the potential of the lid 150 delaminating from the chip package assembly 100. Moreover, the increased surface area improves heat transfer between the lid 150 and the adhesive 140, thus improving the performance of the IC die 114.

In one embodiment, such as shown in the enlarged portion of FIG. 1, the engineered features 180 are in the form of recesses 164 formed in the second surface 162 of the lid 150. The recesses 164 may be a blind hole, groove or have another suitable geometric form. The recesses 164 may have a circular, rectangular, hexagonal or other cross sectional profile. In the embodiment illustrated in FIG. 1, the sidewalls of the recesses 164 are shown as being perpendicular to the second surface 162 of the lid 150. Alternatively, the sidewalls of the recesses 164 may be disposed at an angle less than or greater than 90 degrees relative to the second surface 162 of the lid 150. For example, sidewalls (152 shown in phantom) of the recess 164 may be tapered inward at the bottom of the recess 164 such that the bottom of the recess 164 is wider than the opening of the recess 164 at the second surface 162 of the lid 150. In another example, the sidewalls of the recess 164 may include an undercut or groove. The taper, undercut and/or groove in the sidewalls of the recess 164 improves the adhesion of the adhesive 140 to the lid 150 by providing a mechanical interlock.

The recesses 164 may be formed by machining, laser machining, pattern transfer or additive manufacturing process (such as 3-D printing), among others. Pattern transfer manufacturing techniques may utilize a mask to define openings that exposed predefined portions of the second surface 162 of the lid 150, which may then be selectively removed by etching, bead blasting, grit blasting and the like, to form the recesses 164. Additive manufacturing processes sequentially stack material to form the lid 150, leaving gaps in the stacked material that form the recesses 164 in the second surface 162 of the lid 150 once the additive process is complete.

In another embodiment, such as the partial sectional view of the lid 150 depicted in FIG. 2, the engineered features 180 are in the form of protrusions 200 extending from the second surface 162 of the lid 150. The protrusions 200 may be a post, web, ridge, wall or other discreet projecting structure. In the embodiment illustrated in FIG. 2, the sidewalls of the protrusions 200 are shown as being perpendicular to the second surface 162 of the lid 150. Alternatively, the sidewalls of the protrusion 200 may be disposed at an angle less than or greater than 90 degrees relative to the second surface 162 of the lid 150. For example, the sidewalls (152 shown in phantom) of the protrusions 200 may be tapered outward at the distal end of the protrusion 200 such that the distal end of the protrusion 200 is wider than the portion of the protrusion 200 directly in contact with the second surface 162 of the lid 150. In another example, the sidewalls of the protrusion 200 may include an undercut or groove. The taper, undercut and/or groove in the sidewalls of the protrusion 200 improves the adhesion of the adhesive 140 to the lid 150 by providing a mechanical interlock.

FIG. 3 is a bottom view of one embodiment of the lid 150 utilized in the integrated chip package assembly 100 of FIG. 1. The engineered features 180 of the lid 150 may be recesses 164, protrusions 200 or a combination thereof. The engineered features 180 of the lid 150 are disposed in a two-dimensional array 300 at least across the region 102 of the lid 150. In one example, the engineered features 180 forming the array 300 may be arranged in a grid of rows and columns. In another example, the engineered features 180 forming the array 300 may be disposed in a polar array (not shown). The engineered features 180 may be spaced apart equidistantly. The engineered features 180 may be spaced in a repeating pattern. As discussed above, the engineered features 180 may be formed only in the region 102 of the lid 150 disposed over the dies 114. Alternatively, the engineered features 180 may be formed in the region 104 of the lid 150 outward the region 102, such as shown by the recess 164/protrusion 200 illustrated by a dashed line.

Figure 4:
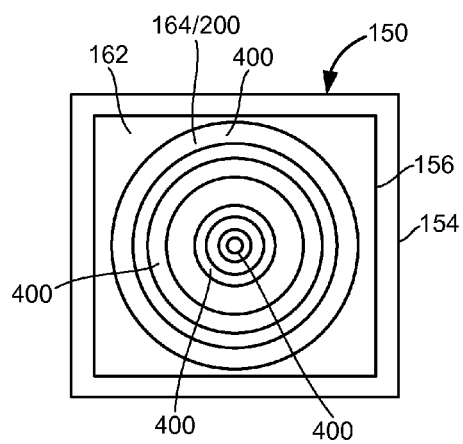
FIGS. 4-6 are bottom views of alternative embodiments of lids that may be utilized in the integrated chip package assembly of FIG. 1.
Figure 5:
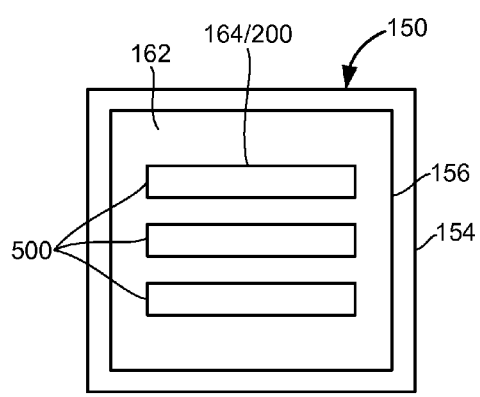
Figure 6:
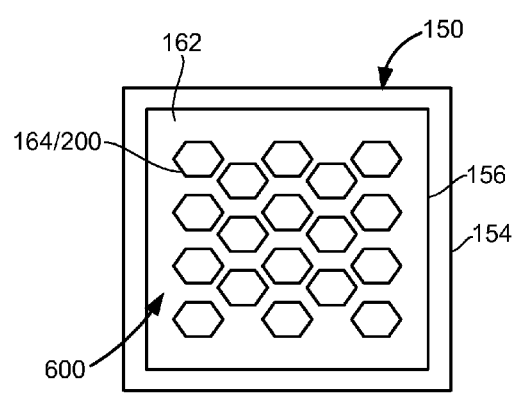

FIGS. 4-6 are a bottom views of alternative embodiments of lids 150 that may be utilized in the integrated chip package assembly 100 of FIG. 1. The engineered features 180 illustrated in FIGS. 4-6 may be recesses 164, protrusions 200 or a combination thereof.

Referring first to FIG. 4, the lid 150 includes a plurality of engineered features 180 formed as rings 400. The rings 400 may be concentric or non-concentric. The rings 400 may be disposed one inside the other. Alternatively, at least two or more of the rings 400 may be disposed outward of each other. The rings 400 may be spaced apart equidistantly. The rings 400 may be spaced in a repeating pattern.

FIG. 5 depicts another arrangement of a plurality of engineered features 180 formed the lid 150. The engineered features 180 are shown in FIG. 5 as being arranged in a plurality of rows 500. Each row 500 of engineered features 180 may be spaced uniformly apart. The rows 500 may be spaced in a repeating pattern. The rows 500 may have a linear geometry as shown in FIG. 5, or alternatively, each row 500 may be non-linear, such as an arc, a wave or stepped pattern.

FIG. 6 depicts another arrangement of a plurality of engineered features 180 formed the lid 150. The engineered features 180 are shown in FIG. 6 as being arranged in a regular lattice 600 that prevents a line of sight between opposite sides of the lid 150 which is uninterrupted by at least one engineered feature 180. For example, the engineered features 180 forming the regular lattice 600 may be arranged in an off-set lattice, such as a hexagonal lattice, which optionally may be closed-packed arrangement. Each engineered feature 180 of the regular lattice 600 may be spaced uniformly apart. The engineered features 180 may be disposed in a close-packed pattern, for example a hexagonal close-packed grid.

It should be noted that some embodiments also may provide a non-linear interface between the adhesive 140 and the lid 150. For example, the interface between the adhesive 140 and the lid 150 across the region 102 may be interrupted by one or more of the engineered features 180 so that an imaginary line extending across the region 102 from opposite sides of the lid 150 is not linear when the engineered features 180 are avoided. That is, at least one or more of the engineered features 180 would lie on the imaginary line if linear, thereby making the interface between the adhesive 140 and the lid 150 deviate from a linear path as the interface passes around the engineered features 180. The non-linear interface advantageously stops crack propagation as any linearly extending propagating creak would eventually encounter and terminate at one of the engineered feature 180. Thus, the engineered features 180 further enhance adhesion of the lid 150 to the chip package assembly 100 by impeding crack propagation. For example, the rings 400 illustrated in FIG. 4 prevents linear crack propagation in the adhesive 140 across the region 102 due to blockage by the engineered features 180 that are arranged in a manner that prevents an uninterrupted linear line of sight across the region 102 at the interface between the adhesive 140 and the lid 150. In another example, the regular lattice 600 illustrated in FIG. 6 may be sufficiently close-packed to prevent linear crack propagation in the adhesive 140 across the region 102 due to blockage by the engineered features 180 that are arranged in a manner that prevents an uninterrupted linear line of sight across the region 102 at the interface between the adhesive 140 and the lid 150.

Figure 7:
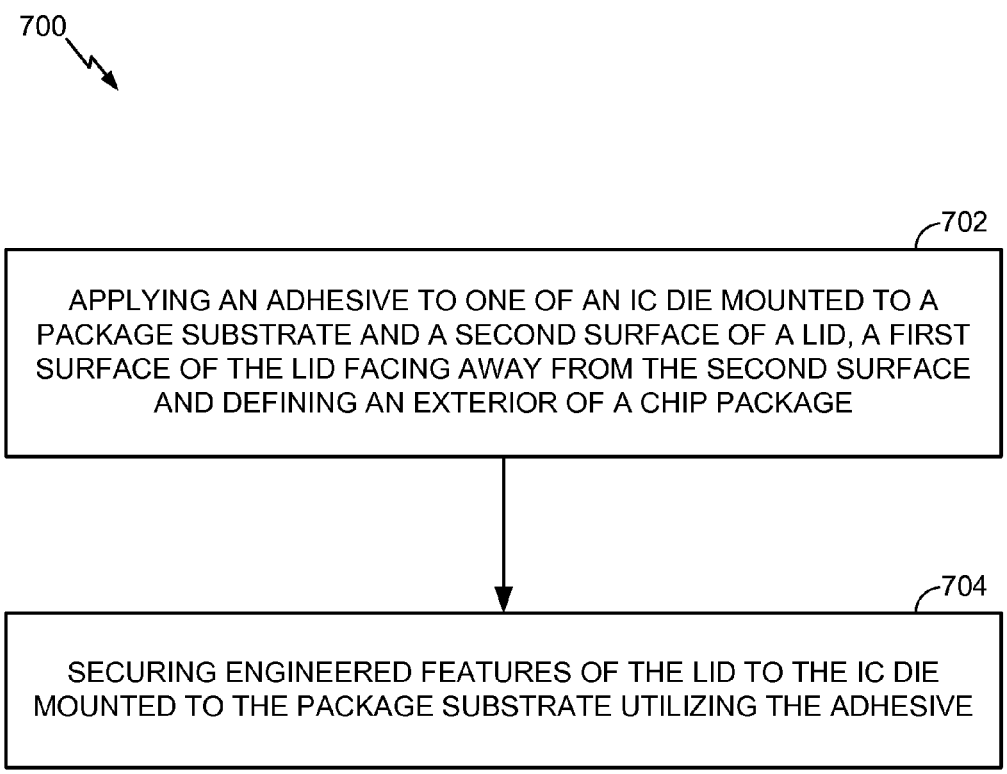
FIG. 7 is a block diagram of one embodiment of a method for forming a chip package assembly having improved lid adhesion.

FIG. 7 is a block diagram of one embodiment of a method 700 for forming a chip package assembly, such as for example the chip package assemblies described above. The method 700 begins at operation 702 by applying an adhesive to one of an IC die and a lid. The IC die is mounted to a package substrate. The lid includes a first surface and a second surface. The first surface of the lid is facing away from the second surface and defines the exterior of the chip package assembly. The IC die may be mounted directly to a package substrate, or be mounted to the package substrate via an interposer.

At operation 704, the lid is secured to the IC die mounted to the package substrate utilizing the adhesive. While securing the lid to the IC die, the adhesive contacts a plurality of engineered features formed on or in the second surface of the lid. The plurality of engineered features increases the surface area between the lid and adhesive, which promotes adhesion and, in some embodiments, also increases the heat transfer between the lid and IC die through the adhesive. In some embodiments, securing of the lid to the IC die may include flowing the adhesive into recesses formed in the lid. In other embodiments, securing of the lid to the IC die may include flowing the adhesive between protrusions projecting from the lid. In yet other embodiments, securing of the lid to the IC die may include forming a non-linear adhesive to lid interface across a region of the lid above the dies. The non-linear adhesive to lid interface inhibits propagation of potential cracks formed in the adhesive.

While securing the lid to the chip package assembly, the adhesive may be heated to promote curing of the adhesive. After assembly of the lid to the chip package assembly, an optional heat sink may be mounted to the first surface of the lid.

The chip package assembly described above advantageously provides better adhesion between the lid and the dies. The better adhesion between the lid and the dies reduces the potential of the lid delaminating from the chip package assembly. Thus, the enhanced adhesion promotes improved heat transfer between the IC die and lid, thereby enhancing temperature control which promotes better device performance over a wider range of operating conditions, with less expense and manufacturing complexity, while additionally providing more uniform chip package assembly to package performance.

While the foregoing is directed to embodiments of the present invention, other and further embodiments of the invention may be devised without departing from the basic scope thereof, and the scope thereof is determined by the claims that follow.

What is claimed is:

1. A chip package assembly, comprising:
   a package substrate;
   an IC die coupled to the package substrate;
   a lid having a first surface and a second surface, the second surface facing away from the first surface and towards the IC die, the second surface having a plurality of engineered features; and
   an adhesive coupling the plurality of engineered features of the second surface of the lid to the IC die;
   wherein the engineered features have a shape configured to form a mechanical interlock with the adhesive; and
   wherein the engineered features are disposed on the second surface of the lid in a pattern that prevents any uninterrupted linear line of sight across a region of the lid disposed over the IC die.

2. The chip package assembly of claim 1, wherein the engineered features comprise:
   recesses formed in the second surface of the lid.

3. The chip package assembly of claim 2, wherein the recesses forming engineered features further comprise:
   a blind hole or groove.

4. The chip package assembly of claim 1, wherein the engineered features comprise:
   protrusions extending from the second surface of the lid.

5. The chip package assembly of claim 4, wherein the protrusions forming engineered features further comprise:
   a post, a web, a ridge, a wall or a discreet projecting structure.

6. The chip package assembly of claim 1 further comprising:
   an interposer coupling the die to the package substrate.

7. The chip package assembly of claim 1, wherein the engineered features are arranged in a pattern of rings disposed one inside the other.

8. The chip package assembly of claim 1, wherein the engineered features are disposed closed-packed arrangement.

9. The chip package assembly of claim 1 further comprising:
   a second IC die coupled to the interposer by a second plurality of solder bumps, the adhesive coupling the engineered features of the second surface of the lid to the second IC die.

10. The chip package assembly of claim 1 further comprising:
    a stiffener coupling the package substrate to the lid.

11. A lid for a chip package assembly having an IC die coupled to a package substrate, wherein the lid comprises:
    a plurality of engineered features having a geometry selected to enhance adhesion of the lid to the IC die disposed in a region of a side of the lid to be coupled by an adhesive to the IC die;
    wherein the engineered features have a shape configured to form a mechanical interlock with the adhesive; and
    wherein the engineered features are disposed on the second surface of the lid in a pattern that prevents any uninterrupted linear line of sight across a region of the lid disposed over the IC die.

12. The lid of claim 11, wherein the engineered features further comprise:
    protrusions extending from the side of the lid or recesses extending into the side of the lid.

13. The lid of claim 12, wherein the engineered features further comprise:
    an undercut, taper or grooves.

14. The lid of claim 11, wherein the engineered features are arranged in a regular lattice.

15. The lid of claim 11, wherein the engineered features are disposed closed-packed arrangement.

16. A method for forming a chip package assembly, the method comprising:
    applying an adhesive to one of an IC die mounted to a package substrate and a second surface of a lid, a first surface of the lid facing away from the second surface; and
    securing the lid to the IC die mounted to the package substrate utilizing the adhesive, wherein during the securing of the lid to the IC die, the adhesive contacts a plurality of engineered features formed on or in the second surface of the lid;
    wherein the engineered features have a shape configured to form a mechanical interlock with the adhesive; and
    wherein the engineered features are disposed on the second surface of the lid in a pattern that prevents any uninterrupted linear line of sight across a region of the lid disposed over the IC die.

17. The method of claim 16, wherein the securing of the lid to the IC die further comprises:
    flowing the adhesive into recesses formed in the lid.

18. The method of claim 16, wherein the securing of the lid to the IC die further comprises:
    flowing the adhesive between protrusions projecting from the lid.

19. The method of claim 17, wherein the securing of the lid to the IC die further comprises:
    forming a non-linear adhesive to lid interface across a region of the lid disposed above the dies.

* * * * *